United States Patent [19]

Carp et al.

[11] 4,159,505

[45] Jun. 26, 1979

[54] PACKAGING ASSEMBLY FOR ELECTRONIC MECHANISM

[75] Inventors: Ralph W. Carp; Bertice E. Walker, Jr.; Richard J. Hyder; Thomas F. Gosnell, Sr., all of Newport News, Va.; Lawrence D. Leadbetter, Lorain, Ohio

[73] Assignee: The Bendix Corporation, Southfield, Mich.

[21] Appl. No.: 806,985

[22] Filed: Jun. 16, 1977

[51] Int. Cl.² .............................................. H05K 5/00
[52] U.S. Cl. .................................... 361/399; 361/408
[58] Field of Search ................ 361/399, 408; 174/525, 174/52 R

[56] References Cited

U.S. PATENT DOCUMENTS

| 3,035,237 | 5/1962 | Schlicke | 361/302 |
|---|---|---|---|
| 3,052,821 | 9/1962 | Scoville | 361/399 |
| 3,165,673 | 1/1965 | Teaf | 361/408 |
| 3,519,890 | 7/1970 | Asby | 361/408 |
| 3,585,333 | 6/1971 | Valle | 361/408 |
| 3,805,117 | 4/1974 | Hausman | 361/395 |
| 3,934,074 | 1/1976 | Evelove | 361/399 |

Primary Examiner—David Smith, Jr.
Attorney, Agent, or Firm—Ken C. Decker; William N. Antonis

[57] ABSTRACT

A package assembly for an electronic mechanism includes a housing which receives an electronic circuit board. Studs carried by the housing are connected to the circuit board by a flexible mechanism so that vibrations are dampened and thermal expansion of the connecting mechanism is accommodated. The connecting mechanism not only supports the circuit board within the housing, but also provides an electrical connection between the terminals on the circuit board and the studs, to which the electrical leads are installed which connect the package to other electronic components.

3 Claims, 4 Drawing Figures

PACKAGING ASSEMBLY FOR ELECTRONIC MECHANISM

BACKGROUND OF THE INVENTION

This invention relates to a packaging assembly for electronic mechanisms.

Until recently, electronic components were rarely used on automotive vehicles, because they were inherently unreliable and were inherently subjected to a rather severe operating environment. For example, electronic components used on vehicles must be subjected to vibration, dirt, and temperature differentials varying over an extremely wide range. However, more recently, electronic devices have been more widely accepted for use on automotive vehicles. For example, adaptive braking systems are now required on all air braked trucks. These adaptive braking systems must respond to speed signals generated by wheel speed sensors and make electronic decisions to control vehicle braking. Since these devices are customarily mounted near the axles of the vehicle which they control, and are subjected to the adverse environment on the underside of the vehicle, electronic components must be packaged to insulate them from the vibration inherent in this environment, from the dirt and road spray which is almost constantly thrown upon them, and from the wide range of temperature differentials inherent in truck operation during all seasons of the year. The package assembly disclosed in the present application is designed to protect electronic circuit boards from vibration, seal the boards from contamination and accommodate the effects of thermal expansion of the components. This is accomplished by providing flexible connections between the terminals on the circuit board and the terminals on the housing to which other components of the system are connected, so that the flexible connections dampen vibrations which would otherwise be transmitted directly to the circuit board, and which also accommodate thermal expansion. The entire assembly is then sealed in a potting gel, to protect the components from environmental contaminants. The terminals carried by the housing are studs to which the electrical leads may be easily connected, and the studs are designed and attached to the housing in such a way that forces applied to the studs when the leads are connected and disconnected are not transmitted to the circuit board.

SUMMARY OF THE INVENTION

Therefore, an important object of our present invention is to provide a packaging assembly for an electronic mechanism which protects the electronic circuit board housed within the assembly from vibration, and also accommodates the effects of thermal expansion and contraction.

Another important object of our invention is to provide an electronic packaging assembly in which the electrical connections between the terminals on the circuit board and the terminals on the housing also mount the circuit board within the housing.

Still another important object of our invention is to provide a housing for an electronic circuit board that protects the circuit board from the effects of environmental contamination.

DETAILED DESCRIPTION

Figure 2:
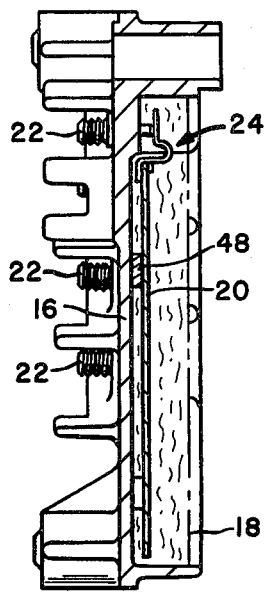
FIG. 2 is a cross-sectional view taken along lines 2—2 of FIG. 1.
Figure 1:
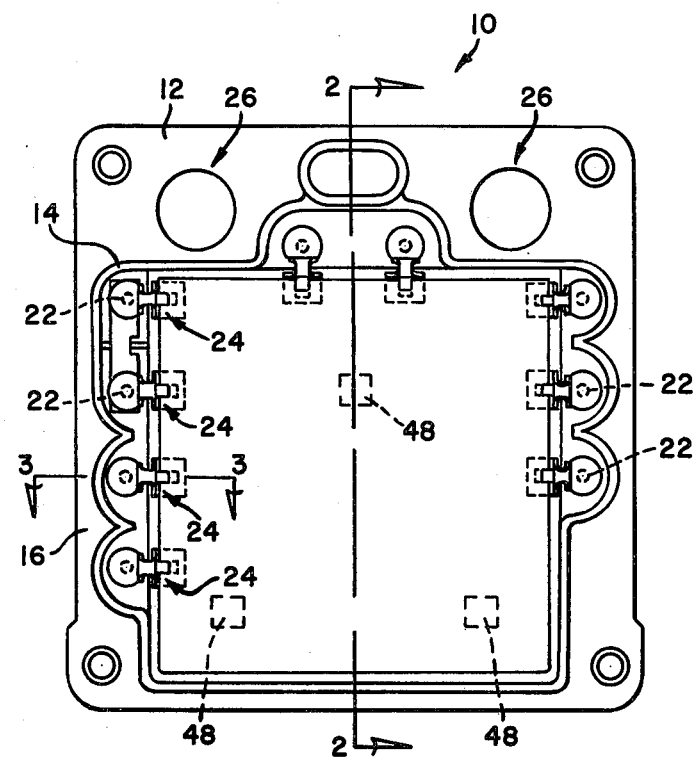
FIG. 1 is a plan view of a packaging assembly made pursuant to the teachings of our present invention illustrating the circuit board installed in the housing, but with the potting gel removed so that the various components and connections may be more easily observed.

Referring now to the drawings, a packaging assembly generally indicated by the nuemral 10 includes a housing 12 having an annular sidewall 14. One end of the housing 12 is closed by a wall 16 and the other end 18 of the housing is open. An electronic circuit board assembly 20 is installed through the open end 18 of the housing 12, and includes electronic circuit components printed and soldered upon it. The closed end 16 of the housing carries studs generally indicated by the numeral 22 to which leads (not shown) are connected which connect the various components of the circuit board 20 with other electronic components in the system. Each of the studs 22 are connected to an appropriate terminal (not shown) on the circuit board 20 by connecting mechanisms generally indicated by the numeral 24. Bolt-receiving bores 26 are provided in the housing to accommodate bolts which install the housing on the vehicle.

Figure 3:
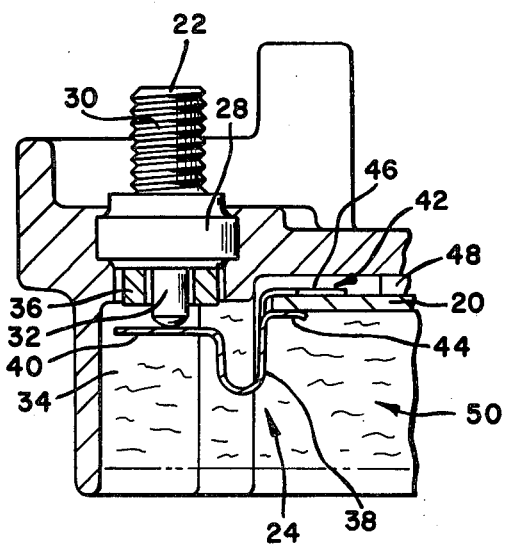
FIG. 3 is an enlarged cross-sectional view taken substantially along lines 3—3 of FIG. 1.
Figure 4:
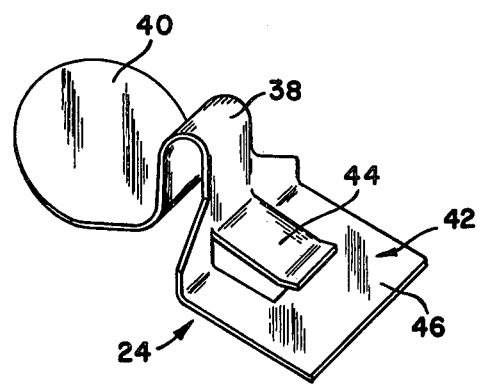
FIG. 4 is a perspective view of a connecting mechanism which is used to install the circuit board in the housing.

Referring now to FIGS. 3 and 4, the construction of the bolts 22 and the connecting mechanisms 24 will be described in detail. The housing 12 is preferably molded out of a plastic or nylon material, and the studs 22 include bosses 28 which are molded integral with the housing 12. Bosses 22 include a threaded portion 30 which projects from the boss 28 outwardly from the closed end 16 of the housing 12. Studs 22 further include another portion 32 which projects in the opposite direction from that of the threaded portion 30, and which extend into the chamber 34 defined by the annular wall 14 and the closed end 16. An annular ferrite bead 36 is received on the portion 32 of the stud 22, for noise suppression purposes. The connecting mechanism 24 is made from resilient material and includes a loop portion 38, one end of which terminates in a flat 40 which is welded to the end of the portion 32 of the stud 22. The other end of the resilient loop 38 terminates in a clip 42 which includes a spring arm 44 cooperating with another arm 46 to yieldably grasp the printed circuit board 20. The clip 42 is soldered to the appropriate terminals of the circuit board 20.

Clearly, the circuit board 20 is provided with several terminals, for the necessary connections with the various inputs and outputs required of the system. Each of the terminals on the circuit board is connected to a corresponding one of the studs 22 in the manner illustrated in detail in FIG. 3. Several relatively small, rectangular cushions 48 are secured to the wall 16, and engage the circuit board 20 to cushion it from being forced against the wall 16. After the circuit board 20 is installed in the compartment 34, a conventional potting gel indicated generally as at 50 filles the compartment 34 and encapsulates the circuit board 20, connecting mechanism 24, and the portion 32 of the studs 22 to protect these components from enviromental contaminants. A mylar cover (not shown) may be used to close the open end of the housing.

As described hereinabove, the connecting mechanisms 24 not only serve as an electrical connection between the circuit board and the studs 22, which act as terminals to which leads connecting the assembly to other electronic components in the system are attached, but also mount the circuit board 20 within the compartment 34 defined within the housing 12. Since the connecting mechanism 24 is made from resilient material, the resilient loop 38 may flex to accommodate thermal expansion of the various components of the assembly. Furthermore, the resilient nature of the connecting mechansim 24 serves to dampen or absorb vibrations which would otherwise be transmitted from the housing or stud to the circuit board 20. Since the boss 28 is molded integrally with the housing 12, and since the only connection between the studs 22 and the circuit board 20 is through the resilient connecting mechanism 24, forces applied to the studs 22 during connection of the aforementioned leads will not be transferred to the circuit board 20. Therefore, the assembly 10 serves to isolate and protect the circuit board 20 from vibrations, protects the components from thermal expansion due to the wide temperature variations through which the vehicle upon which the assembly 10 is mounted may be operated, and also protects the electronic components from contamination by environmental substances.

We claim:
1. A packaging assembly for an electronic mechanism comprising a housing, a circuit board mounted in said housing, a stud carried by said housing and including a threaded portion projecting away from said housing, another portion projecting into said housing, and intermediate boss means located between said threaded portion and said another portion for securing said stud to said housing and for transferring forces exerted on said threaded portion to said housing, said threaded portion and said another portion being electrically conductive to define a circuit path through the housing, and means interconnecting the stud and the circuit board to provide an electrically conductive path therebetween and to support the circuit board within the housing, said interconnecting means including a clip for attachment with the circuit board and a flat for connection with said another portion of the stud, and a loop of resilient electrically conductive material interconnecting the flat and the clip.
2. The invention of claim 1:
said boss being molded into the wall of the housing when the housing is molded.
3. The invention of claim 1:
said clip being soldered to the circuit board, said flat being welded to the another portion of the stud.

* * * * *